United States Patent
Singh

(10) Patent No.: US 7,067,882 B2
(45) Date of Patent: Jun. 27, 2006

(54) HIGH QUALITY FACTOR SPIRAL INDUCTOR THAT UTILIZES ACTIVE NEGATIVE CAPACITANCE

(75) Inventor: Prashant Singh, Eden Praire, MN (US)

(73) Assignee: LSI Logic Corporation, Milpitas, CA (US)

( * ) Notice: Subject to any disclaimer, the term of this patent is extended or adjusted under 35 U.S.C. 154(b) by 340 days.

(21) Appl. No.: 10/650,395

(22) Filed: Aug. 28, 2003

(65) Prior Publication Data
US 2005/0047064 A1    Mar. 3, 2005

(51) Int. Cl.
*H01L 27/01* (2006.01)
(52) U.S. Cl. .................. 257/351; 174/255
(58) Field of Classification Search ........... 257/528, 257/531, 351; 361/761, 763, 764; 174/255
See application file for complete search history.

(56) References Cited

U.S. PATENT DOCUMENTS 5,760,456 A * 6/1998 Grzegorek et al. ......... 257/531
6,201,287 B1 * 3/2001 Forbes .................... 257/528
6,385,019 B1 * 5/2002 Gagne et al. .............. 361/15

* cited by examiner

*Primary Examiner*—Randy W. Gibson
*Assistant Examiner*—Yuriy Semenenko
(74) *Attorney, Agent, or Firm*—Suiter - West - Swantz PC LLO

(57) ABSTRACT

The present invention is an apparatus and system for providing a high quality spiral inductor in an integrated circuit environment. A layer of inductor may be placed within the metal layers along with negative capacitance generation circuitry of the present invention to compensate for the capacitance associated with the metal layers adjacent to the inductor to provide a higher quality factor for the inductor. Advantageously, circuitry of the present invention may be employed within an integrated circuit without modifying the layer structure of the integrated circuit. Additionally, values of the components of the circuitry may be selectively and independently chosen to synthesize a variable range of negative capacitance.

17 Claims, 3 Drawing Sheets

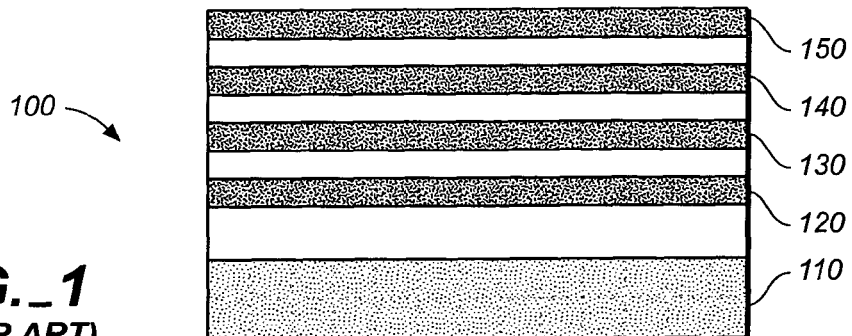
FIG._1
(PRIOR ART)
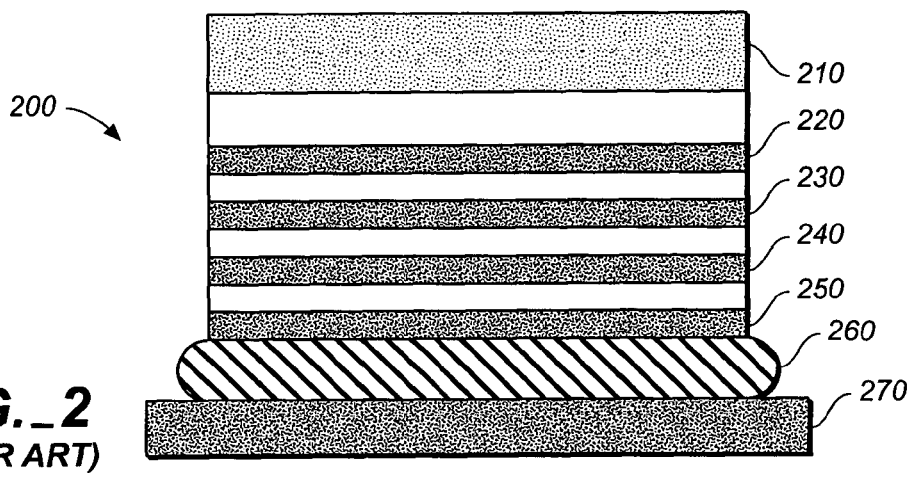
FIG._2
(PRIOR ART)
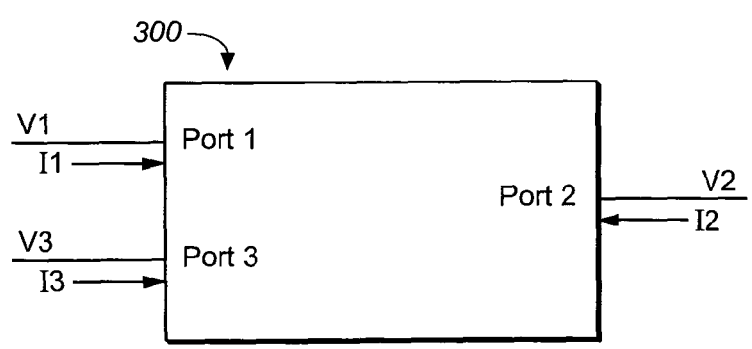
FIG._3

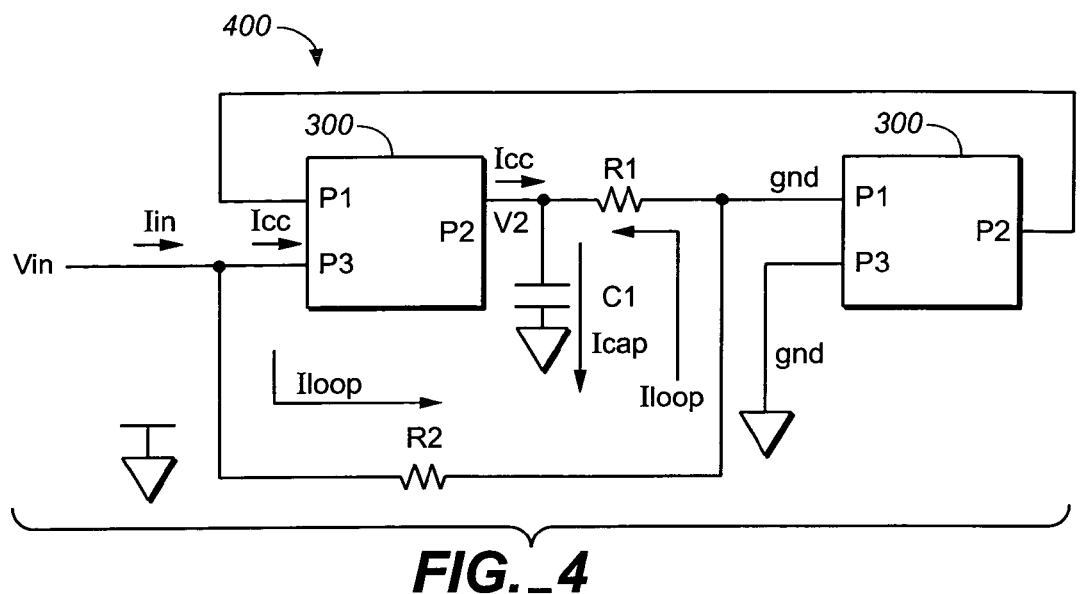
FIG._4
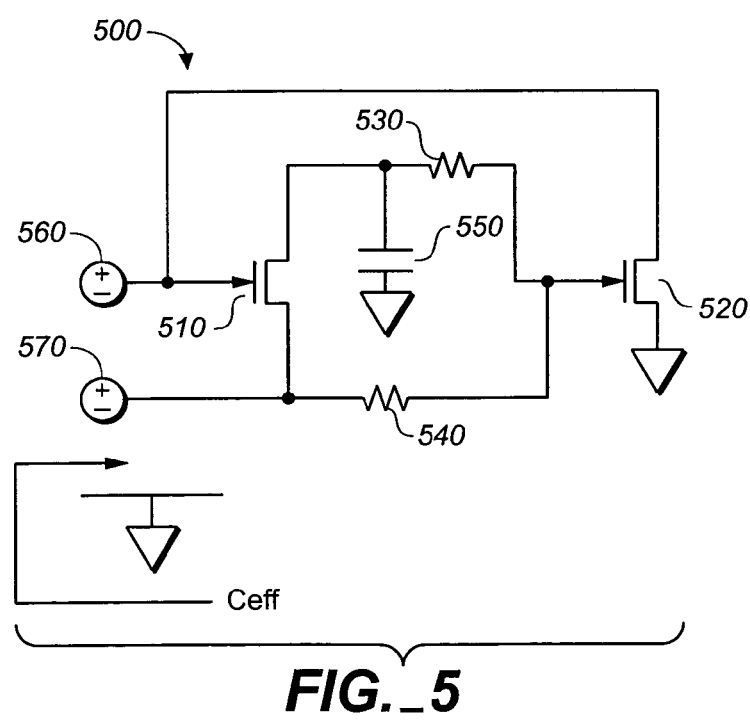
FIG._5

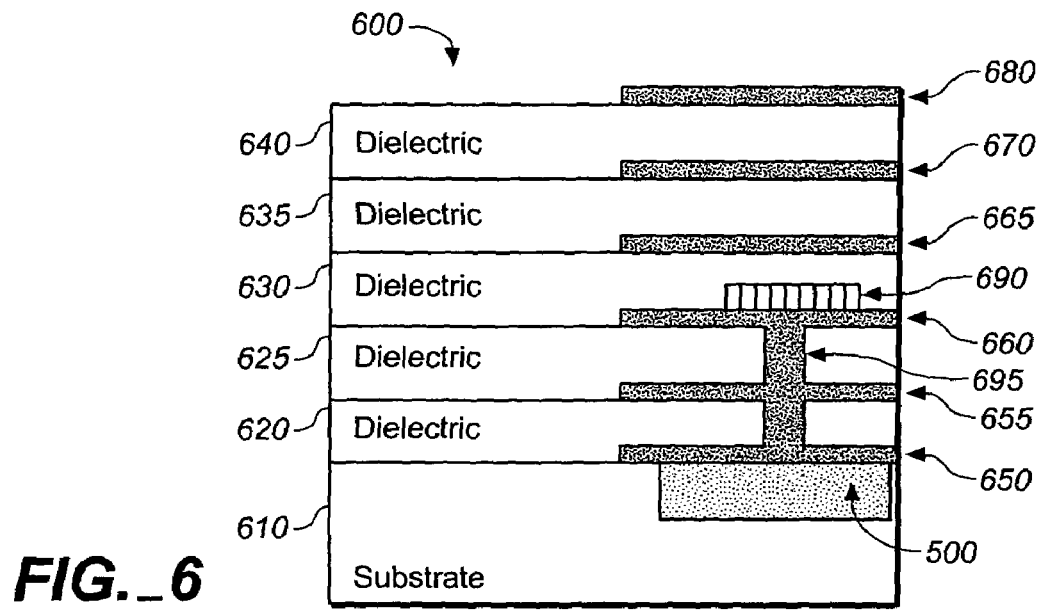
FIG._6
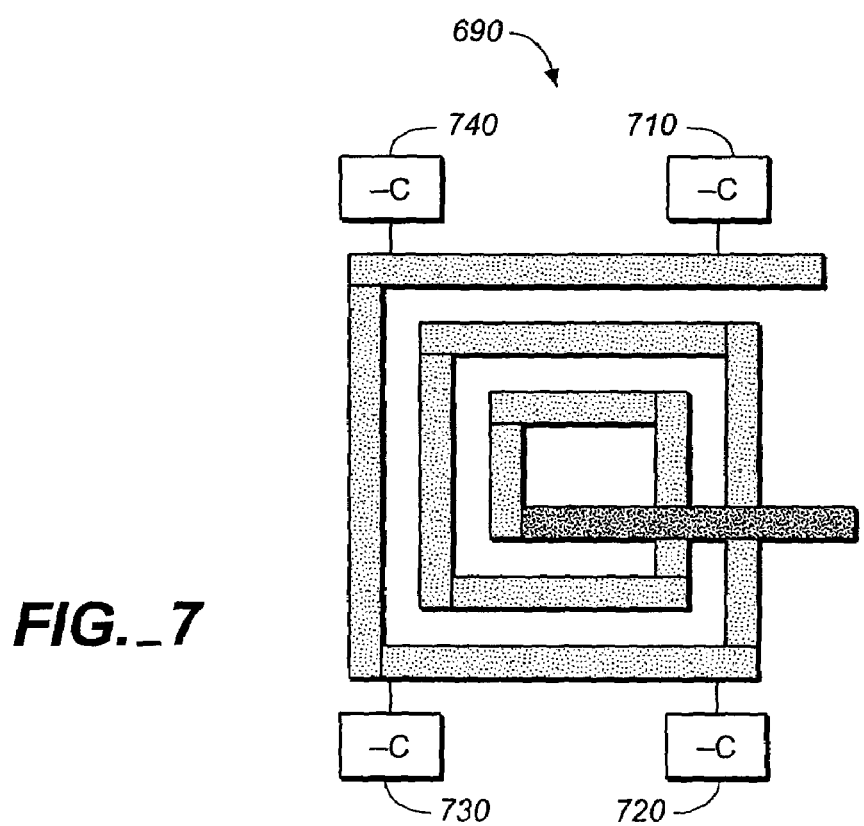
FIG._7

HIGH QUALITY FACTOR SPIRAL INDUCTOR THAT UTILIZES ACTIVE NEGATIVE CAPACITANCE

FIELD OF THE INVENTION

The present invention generally relates to the field of integrated circuits, and more particularly to an apparatus for providing a high quality factor spiral inductor within an integrated circuit.

BACKGROUND OF THE INVENTION

Integrated circuits are employed in most of the digital appliances utilized on a daily basis by consumers. Integrated circuits may refer to an electronic circuit built onto a single piece of substrate, a chip, and enclosed within a package. Integrated circuits generally perform a desired function or a plurality of functions.

A spiral inductor is commonly utilized in radio-frequency (RF) circuits, voltage-controlled oscillators, low-noise amplifiers and passive element filters. Performance of RF circuits, voltage-controlled oscillators, low-noise amplifiers and passive element filters are found to benefit from a higher quality factor inductor. In some silicon semiconductor integrated circuits, especially those used in flip chip applications, there are problems associated with the traditional spiral inductor configuration.

Referring to FIG. 1, an integrated circuit 100 known to the art is shown. Integrated circuit 100 may include a substrate 110 and a plurality of metal layers 120–150 and an inductor (not shown). If the spiral inductor is placed in the middle of the metallization stack of the integrated circuit 100, such as between metal layer 130 and metal layer 140, a high capacitance associated with the adjacent metal layers may reduce performance of the inductor. Specifically, this capacitance reduces the self resonant frequency and quality factor of the inductor.

Referring to FIG. 2, an integrated circuit 200 in a flip-chip configuration known to the art is shown. The integrated circuit 200 may include a substrate 210, a plurality of metal layers 220–250, underfill material 260 and a package substrate 270. A conventional solution to the problem of capacitance associated with metal layers 220–250 adjacent to the inductor is to place the spiral inductor on top of the metal stack of the integrated circuit 200. For example, the spiral inductor may be placed on the metal layer 250 in proximity to the underfill material 260. However, the electromagnetic field lines of the inductor interact with the underfill material 260 between the chip and the package substrate 270. The underfill material 260 has varying and often poor microwave properties which adversely affect the quality factor of the spiral inductor. Consequently, an inductor that provides a high quality factor within an integrated circuit environment is necessary.

SUMMARY OF THE INVENTION

Accordingly, the present invention is directed to an apparatus and system for providing a high quality spiral inductor in an integrated circuit environment. In an embodiment of the invention, a layer of inductor may be placed within the metal layers. Negative capacitance generation circuitry of the present invention may be employed with the layer of inductor to compensate for the capacitance associated with the metal layers adjacent to the inductor to provide a higher quality factor for the inductor. Further, circuitry of the present invention may be employed within an integrated circuit without modifying the layer structure of the integrated circuit. In an advantageous aspect of the present invention, values of the components of the circuitry may be selectively and independently chosen to synthesize a variable range of negative capacitance.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 depicts an embodiment of an integrated circuit known to the art;

FIG. 2 depicts an embodiment of an integrated circuit in a flip-chip configuration known to the art;

FIG. 3 depicts an embodiment of a current conveyor in accordance with the present invention;

FIG. 4 depicts an embodiment of a negative capacitance generator 300 with two current conveyors in accordance with the present invention;

FIG. 5 depicts an embodiment of active circuitry for generating a negative capacitance in accordance with the present invention;

FIG. 6 depicts an embodiment of an integrated circuit employing active circuitry for generating a negative capacitance in accordance with the present invention; and FIG. 7 depicts an embodiment of an inductor layer in accordance with the present invention.

DETAILED DESCRIPTION OF THE INVENTION

Reference will now be made in detail to the presently preferred embodiments of the invention, examples of which are illustrated in the accompanying drawings.

Referring to FIG. 3, an embodiment of a current conveyor 300 in accordance with the present invention is shown. Current conveyor 300, a three port device, may be the building block of a negative capacitance generator (shown in FIG. 4) of the present invention, with the following properties:

$$\begin{bmatrix} i1 \\ i2 \\ v3 \end{bmatrix} = \begin{bmatrix} 0 & 0 & 0 \\ 0 & -1 & 0 \\ 1 & 0 & 0 \end{bmatrix} \begin{bmatrix} v1 \\ i3 \\ v3 \end{bmatrix} \quad \text{(Equation 1)}$$

From Equation 1, the following equations may be obtained:

$i1=0$ $i2=-i3$ $v3=v1$

From these equations, it may be determined that the current conveyor 300 has a high impedance node at Port 1, in which there may be no current flow. Current conveyor 300 may also have a voltage follower property that may transfer the voltage at Port 1 to Port 3 along with a current flow property that may transfer current from Port 3 through Port 1.

Referring to FIG. 4, an embodiment of a negative capacitance generator 400 with two current conveyors in accordance with the present invention is shown. From an analysis of FIG. 4 and employing well known electrical principles, the following relations may be obtained:

$$Iin = Icc + Iloop \quad \text{(Equation 2)}$$

$$Icc + Iloop = Icap \quad \text{(Equation 3)}$$

$$Vin = Iloop * R2 \quad \text{(Equation 4)}$$

$$V2 = -Iloop * R1 \quad \text{(Equation 5)}$$

$$Icap = V2/j\omega C \quad \text{(Equation 6)}$$

By combining Equation 2 and Equation 3, $$Iin = Icap \quad \text{(Equation 7)}$$

Equation 6 may be written as:

$$Icap = V2/j\omega C = -Iloop * R1/j\omega C = -Vin * R1/R2 * j\omega C \quad \text{(Equation 8)}$$

Equation 7 and Equation 8 may be combined to yield $$Iin/Vin = -(R1/R2) * j\omega C = j\omega Ceff \quad \text{(Equation 9)}$$

From Equation 9, the effective capacitance into Port 3 of the negative capacitance generator 300 may be determined as:

$$Ceff = -(R1/R2) * C \quad \text{(Equation 10)}$$

Referring to FIG. 5, an embodiment of circuitry 500 for generating a negative capacitance in accordance with the present invention is shown. It is contemplated that current conveyor 300 of the present invention may be implemented through a transistor, such as an n-channel metal oxide silicon field effect transistors (MOSFET). In the embodiment of employing a MOSFET, Ports 1–3 of FIG. 3 may refer to the terminals of the MOSFET whereby Port 1 may refer to the gate, Port 2 may refer to the drain, and Port 3 may refer to the source. Consequently, negative capacitance generator 400 of FIG. 4 may be implemented as shown in circuitry 500 as shown in FIG. 5.

Active circuitry 500 may include a pair of transistors 510–520, resistors 530–540, capacitor 550. Transistor 510 and transistor 520 each operate as a current conveyor 300 of FIG. 3. Since Port 1 of FIG. 3 is the gate of a MOSFET, the current that flows into the drain is equal to the current that flows out of the source. In some applications of a MOSFET embodiment, the gate to source voltage drop may prevent the gate voltage from being identically equal source voltage. Thus, in an alternative embodiment, multiple MOSFETS may be utilized in parallel, rather than employing a single MOSFET 510–520 to reduce the gate to source voltage drop closer to zero. For example, a pair of MOSFET transistors connected in parallel may take the place of transistor 510 while another pair of transistors connected in parallel may take the place of transistor 520. This is advantageous as this may allow the gate voltage to be approximately equal to the source voltage.

Two bias voltages 560–570 may be utilized to control operation of the circuitry 500. Bias voltages 560–570 may be coupled to voltage controls of an integrated circuit in which the circuitry 500 has been included to compensate for the capacitance associated with the metal layers adjacent to the inductor. In an advantageous aspect of the present invention, a negative capacitance may be produced as previously described with respect to the negative capacitance generator 400 of FIG. 4. The value of the negative capacitance produced:

$$Ceff = (\text{Resistor 530/Resistor 540}) * \text{Capacitor 550}$$

While active circuitry 400 shown in FIG. 5 employs n channel metal oxide silicon field effect transistors (MOSFETS), it is contemplated that the circuitry could employ bipolar transistors or gallium arsenide pseudomorphic high-electron mobility transistors (PHEMTS) without departing from the scope and spirit of the present invention. Additionally, other types of circuits may be employed to generate a negative capacitance as contemplated by one of ordinary skill in the art without departing from the scope and intent of the present invention.

An advantageous aspect of active circuitry 500 of the present invention lies in the adjustability of the negative capacitance produced. By simply adjusting the values for resistors 530–540 and capacitor 550, the negative capacitance produced by the active circuitry may be adjusted. This is advantageous from a manufacturing perspective as the same circuitry may be manufactured with different component values to compensate for different capacitances associated with different types of integrated circuits.

Referring now to FIG. 6, an embodiment of an integrated circuit 600 employing active circuitry for generating a negative capacitance in accordance with the present invention is shown. Integrated circuit 600 may include a plurality of dielectric layers 620–640 and a plurality of metal layers 650–670 and a bondpad 680. Metal layers may refer to any type of metal utilized in the formation and fabrication of integrated circuits, similarly dielectric materials may include various forms of nonconductors known to the art.

Negative capacitance circuitry 500 may be fabricated in the silicon substrate 610 of the integrated circuit 600. The negative capacitance circuitry 500 may be coupled to the inductor layer 690 through a stack 695. The stack 695, also known as a via by those with ordinary skill in the art, may run through the metal and dielectric layers from the silicon substrate 610 to the inductor layer 690. It is contemplated that stack 695 may be formed of metal or other conducting material and connected to the portion of the equivalent capacitance portion (Ceff) of the negative capacitance circuitry 500 of FIG. 5.

Placement of the inductor layer 690 at or near the middle of the metal layers is advantageous. First, placement of the inductor layer at or near the middle of the metal layers may prevent the electromagnetic field lines of the inductor from being exposed to the underfill material between the chip and the package. Additionally, this may allow a flip chip configuration for the integrated circuit 600 of the present invention, which is advantageous for high speed, high input/output density application specific integrated circuits (ASICS).

An amount of negative capacitance produced may be a value, i.e. a magnitude, to compensate for the positive capacitance associated with the metal layers adjacent to the inductor layer 690. Advantageously, this amount may reduce the negative effects associated with adjacent metal layers and may improve the self resonant frequency and quality factor of the inductor layer 690, creating increased performance of the integrated circuit 600. Additionally, the value of the negative capacitance produced by the circuitry 500 of the present invention may be approximately equal in magnitude to the capacitance associated with the adjacent metal layers whereby magnitude refers to a quantity. For example, the adjacent metal layers may produce a capacitance of +10 microFarads as an arbitrary value. In this same example, a negative capacitance of −10 microFarads may be generated by circuitry 500, thus, the magnitude of the negative capacitance generated would be approximately equal to the magnitude of the adjacent metal layers.

In an advantageous aspect of the present invention, the negative capacitance circuitry 500 may be fabricated within the silicon substrate 610 during the manufacture of the integrated circuit. This provides a cost-effective method of compensating for the capacitance associated with the metal layers adjacent to the inductor. Additionally, the negative capacitance circuitry 500 of the present invention may be incorporated within the integrated circuit 600 without modifying the layer structure of the integrated circuit.

It is contemplated that the negative capacitance circuitry 500 may be employed with a number of different embodiments of integrated circuits in order to compensate for the capacitance associated with the metal layers adjacent to the inductor layer without departing from the scope and intent of the present invention. For example, silicon substrate may be formed of other materials known to the art. One or more layers of dielectric material and metal layers may be employed in alternative embodiments of the invention.

Referring to FIG. 7, an embodiment of an inductor layer 690 in accordance with the present invention is shown. The embodiment of inductor layer of 690 shown in FIG. 7 may be representative of the inductor layer 690 of FIG. 6. Inductor layer 690 may be formed in a spiral configuration. In alternative embodiments of the invention, inductor layer 690 may be formed according to other types of configurations. Negative capacitance generated from negative capacitance circuitry 500 may be placed in shunt with the inductor layer 690 at a plurality of nodes 710–740 of the inductor layer. For example, the stack 695 of FIG. 6 may be coupled from the negative capacitance circuitry 500 of FIG. 6 to the inductor layer 690 and further coupled in parallel to the inductor layer at nodes 710–740. It is contemplated that other types of connections from the stack 695 to the inductor layer 690 may be employed by those with ordinary skill in the art to provide the negative capacitance without departing from the scope and intent of the present invention.

In an advantageous aspect of the present invention, inductor layer 690 may be implemented within an integrated circuit while meeting metal utilization standards. For example, one such standard is that a fraction, i.e. 40%, of each layer is covered with metal. In order to achieve this standard, open space around the inductor may be covered with metal to obtain an amount of metal to satisfy the standard. With metal being adjacent to the inductor, additional parasitic capacitance may be created. However, by employing the negative capacitance circuitry of the present invention, metal may surround the inductor without negatively impacting the performance of the inductor because the capacitance associated with the adjacent metal may be compensated by the negative capacitance circuitry of the present invention.

It is believed that the system and method and system of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An integrated circuit, comprising:
    a substrate;
    a plurality of metal layers, a first metal layer of said plurality of metal layers being disposed on said substrate;
    an inductor layer disposed within said plurality of metal layers; and
    a circuitry for generating a negative capacitance, said circuitry comprising:
        at least two transistors;
        at least two resistors; each resistor of said at least two resistors being coupled to each of said at least two transistors; and
        a capacitor coupled to a first transistor of said at least two transistors and a first resistor of said at least two resistors;
    wherein said circuitry generates said negative capacitance of a value to compensate for a capacitance associated with metal layers adjacent to said inductor layer, said circuitry being coupled to said inductor layer.

2. The integrated circuit as claimed in claim 1, wherein a value of said negative capacitance is approximately equal in magnitude to said capacitance associated with metal layers adjacent to said inductor layer.

3. The integrated circuit as claimed in claim 1, wherein said at least two transistors are at least one of bipolar transistors, MOSFETS, and gallium arsenide pseudomorphic high-electron mobility transistors.

4. The integrated circuit as claimed in claim 1, wherein said negative capacitance generated by said circuitry is dependent upon component values of said at least two resistors and said capacitor.

5. The integrated circuit as claimed in claim 1, wherein said circuitry is fabricated within the substrate.

6. An integrated circuit, comprising:
    a substrate;
    a plurality of metal layers, a first metal layer of said plurality of metal layers being disposed on said substrate;
    an inductor layer disposed within said plurality of metal layers;
    a circuitry for generating a negative capacitance fabricated within said substrate,
    said circuitry comprising:
        at least two transistors;
        at least two resistors; each resistor of said at least two resistors being coupled to each of said at least two transistors; and
        a capacitor coupled to a first transistor of said at least two transistors and a first resistor of said at least two resistors; and
    a via coupling said circuitry to said inductor layer,
    wherein said circuitry generates said negative capacitance of a value to compensate for a capacitance associated with metal layers adjacent to said inductor layer, said value of said negative capacitance being approximately equal in magnitude to said capacitance associated with metal layers adjacent to said inductor layer.

7. An integrated circuit, comprising:
    a substrate;
    a plurality of metal layers, a first metal layer of said plurality of metal layers being disposed on said substrate;

an inductor layer disposed within said plurality of metal layers;

a circuitry for generating a negative capacitance, said circuitry comprising:
  at least two transistors;
  at least two resistors; each resistor of said at least two resistors being coupled to each of said at least two transistors; and
  a capacitor coupled to a first transistor of said at least two transistors and a first resistor of said at least two resistors; and a via coupling said circuitry to said inductor layer, wherein said circuitry generates said negative capacitance of a value to compensate for a capacitance associated with metal layers adjacent to said inductor layer, said value of said negative capacitance being approximately equal in magnitude to said capacitance associated with metal layers adjacent to said inductor layer.

8. An apparatus, comprising: a housing; a substrate disposed within said housing; a plurality of metal layers, a first metal layer of said plurality of layers being disposed on said substrate; an inductor layer disposed within said plurality of metal layers; a circuitry for generating a negative capacitance, said circuitry comprising: at least two transistors; at least two resistors; each resistor of said at least two resistors being coupled to each at least transistors; and a capacitor coupled to a first transistor of said two transistors and a first resistor of said at least two resistors; wherein said circuitry generates said negative capacitance of a value to compensate for a capacitance associated with metal layers adjacent to said inductor layer, said circuitry being coupled to said inductor layer.

9. The apparatus as claimed in claim 8, wherein said value of said negative capacitance is approximately equal in magnitude to said capacitance associated with metal layers adjacent to said inductor layer.

10. The apparatus as claimed in claim 8, wherein said at least two transistors are at least one of bipolar transistors, MOSFETS, and gallium arsenide pseudomorphic high-electron mobility transistors.

11. The apparatus as claimed in claim 8, wherein said negative capacitance generated by said circuitry is dependent upon a component values of said at least two resistors and said capacitor.

12. The apparatus as claimed in claim 11, wherein said negative capacitance generated by said circuitry is dependent upon a ratio of the first resistor to a second resistor of said at least two resistors multiplied by a value of said capacitor.

13. The apparatus as claimed in claim 8, wherein said circuitry is fabricated within the substrate.

14. The apparatus, comprising: a substrate disposed within said housing; a plurality of metal layers, a first metal layer of said plurality of metal layers being disposed on said substrate; an inductor layer disposed within said plurality of metal layers; a circuitry for generating a negative capacitance, said circuitry comprising: at least two transistors; at least two resistors; each resistor of said at least two resistors being coupled to each at least transistors; and a capacitor coupled to a first transistor of said two transistors and a first resistor of said at least two resistors; wherein said circuitry generates said negative capacitance of a value approximately equal in magnitude to a capacitance associated with metal layers adjacent to said inductor layer, said circuitry being fabricated within said substrate, said circuitry being coupled to said inductor layer.

15. The apparatus, as claimed in claim 14, wherein said at least two transistors are at least one of bipolar transistors, MOSFETS, and gallium arsenide pseudomorphic high-electron mobility transistors.

16. The apparatus as claimed in claim 14, wherein said negative capacitance generated by said circuitry is dependent upon component values of said at least two resistors and said capacitor.

17. The apparatus as claimed in claim 16, wherein said negative capacitance generated by said circuitry is dependent upon a ratio of a first resistor to a second resistor of said at least two resistors multiplied by a value of said capacitor.

* * * * *